United States Patent
Park et al.

(10) Patent No.: US 11,526,037 B2
(45) Date of Patent: Dec. 13, 2022

(54) SEMICONDUCTOR DEVICE (71) Applicant: Samsung Electronics Co., Ltd., Suwon-si (KR)

(72) Inventors: Yong Sang Park, Seoul (KR); Hyun Il Byun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 560 days.

(21) Appl. No.: 16/654,019

(22) Filed: Oct. 16, 2019

(65) Prior Publication Data

US 2020/0124879 A1 Apr. 23, 2020

(30) Foreign Application Priority Data

Oct. 17, 2018 (KR) .................. 10-2018-0123626

(51) Int. Cl.
*G02F 1/00* (2006.01)
*G02F 1/015* (2006.01)
*H01L 27/12* (2006.01)

(52) U.S. Cl.
CPC .......... *G02F 1/015* (2013.01); *H01L 27/1203* (2013.01)

(58) Field of Classification Search
CPC ............ G02B 6/12004; G02B 6/12011; G02B 2006/12061; G02B 2006/12176; G02B 6/12007; G02B 6/1225; G02B 6/1228; G02B 6/124; G02B 6/2861; G02B 6/34; G02B 6/12026; G02B 2006/12104; G02B 2006/12107; G02B 2006/12114; G02B 2006/12164; G02B 6/10; G02B 6/4232; G02B 6/43; G02B 27/285; G02B 6/12033; G02B 2006/12097; G02B 2006/12135; G02B 2006/12161; G02B 5/045; G02B 6/29349; G02B 2006/12038; G02B 6/29358; G02B 6/4215; G02B 6/29395; G02B 6/272; G02B 6/12016; G02B 6/29325; G02B 6/29391; G02B 6/12028; G02B 6/2931; G02B 6/29311; G02B 6/29314; G02B 6/29352; G02B 6/132;

(Continued)

(56) References Cited

U.S. PATENT DOCUMENTS

7,109,051 B2 * 9/2006 Cave .................... H01L 27/144
                                                    257/E27.127
7,453,132 B1    11/2008 Gunn, III et al.
8,633,067 B2     1/2014 Assefa et al.
(Continued)

*Primary Examiner* — Thong Q Le
(74) *Attorney, Agent, or Firm* — Muir Patent Law, PLLC (57) ABSTRACT

A semiconductor device includes a base substrate comprising a first region and a second region, a photonics device disposed in the first region, the photonics device comprising a first doped layer disposed on the base substrate, and a second doped layer disposed on the first doped layer so that at least a portion vertically overlaps the first doped layer, the second doped layer having a first vertical thickness, and a transistor disposed in the second region, the transistor comprising a semiconductor layer disposed on the base substrate and horizontally spaced apart from the first doped layer, and a gate electrode horizontally spaced apart from the second doped layer and disposed on the semiconductor layer, disposed at the same vertical level as that of the second doped layer, and having a second vertical thickness equal to the first vertical thickness.

20 Claims, 7 Drawing Sheets (58) Field of Classification Search
CPC ...... G02B 6/29361; G02B 2006/12085; G02B 2006/121; G02B 2006/12123; G02B 6/12
USPC ........ 385/14, 40, 2, 129, 8, 39, 50, 147, 15, 385/27, 1, 11, 131, 125, 30, 31, 37, 9, 10, 385/12, 122, 130, 140, 141, 28, 3, 33, 36, 385/49, 5; 359/244, 321
See application file for complete search history.

(56) References Cited

U.S. PATENT DOCUMENTS

| | | |
|---|---|---|
| 9,036,959 B2 | 5/2015 | Assefa et al. |
| 9,059,025 B2 | 6/2015 | Assefa et al. |
| 9,087,952 B2 | 7/2015 | Assefa et al. |
| 9,117,946 B2 * | 8/2015 | Assefa ................ H01L 31/0745 |
| 9,136,303 B2 | 9/2015 | Assefa et al. |
| 9,484,367 B2 | 11/2016 | Assefa et al. |
| 9,488,776 B2 | 11/2016 | Hill et al. |
| 10,026,852 B2 | 7/2018 | Assefa et al. |

* cited by examiner

SEMICONDUCTOR DEVICE

This application claims priority to Korean Patent Application No. 10-2018-0123626, filed on Oct. 17, 2018, and all the benefits accruing therefrom under 35 U.S.C. § 119, the disclosure of which is incorporated herein by reference in its entirety.

BACKGROUND

1. Technical Field

The present disclosure relates to a semiconductor device, and more particularly to a semiconductor device including a photonics device and a transistor.

2. Description of the Related Art

Increase in demands for high speed communication facilitates an optical interconnect having advantages of high speed and low damage. Such optical interconnects have recently been expanded in utilization. Specifically, the photoelectron integration technology (silicon photonics) based on silicon is being implemented because of compatibility with CMOS fabrication.

For driving of such silicon photonics photoelectron device, electrical control circuits are typically required, and in related art, connection has been made through designing packages with an additional independent chip.

SUMMARY

A technical object of the present disclosure is to provide a miniaturized semiconductor device by integrating a photonics device and a transistor within the same semiconductor chip.

Another technical object of the present disclosure is to provide a semiconductor device to simplify a manufacturing fabrication by disposing a modulator and a transistor included in the photonics device through the same manufacturing fabrication at the same vertical level.

According to an exemplary embodiment of the present disclosure, there is provided a semiconductor device, comprising a base substrate comprising a first region and a second region spaced apart from each other in a first direction, the semiconductor device comprising a photonics device disposed in the first region and configured to generate an optical signal, the photonics device comprising a first doped layer disposed on the base substrate, and a second doped layer disposed on the first doped layer so that at least a portion of the second doped layer overlaps the first doped layer in a second direction orthogonal to the first direction, the second doped layer having a first thickness in the second direction, and a transistor disposed in the second region and configured to provide a drive signal to the photonics device, the transistor comprising a semiconductor layer disposed on the base substrate and spaced apart from the first doped layer in the first direction, and a gate electrode spaced apart from the second doped layer in the first direction and disposed on the semiconductor layer, disposed at the same level in the second direction as that of the second doped layer, and having a second thickness in the second direction equal to the first thickness.

According to an exemplary embodiment of the present disclosure, there is provided a semiconductor device, comprising a base substrate comprising a first region and a second region spaced apart from each other in a first direction, a first insulating layer disposed on the base substrate, a photonics circuit disposed in the first region and configured to transform an electric signal to an optical signal, the photonics circuit comprising a first doped layer disposed on the first insulating layer in the first region, a first portion of a second insulating layer disposed on at least a portion of the first doped layer, a second doped layer disposed on the first doped layer and having a first thickness in a second direction perpendicular to the first direction, and a transistor disposed in the second region and configured to provide a drive signal as the electric signal to the photonics circuit, the transistor comprising a semiconductor layer disposed in the second region, and a gate electrode disposed on a second portion of the second insulating layer in the second region and having a second thickness in the second direction equal to the first thickness.

According to an exemplary embodiment of the present disclosure, there is provided a semiconductor device, comprising a base substrate comprising a first region and a second region horizontally spaced apart from each other, a modulator comprising a first doped layer and a second doped layer stacked sequentially on base substrate in the first region, and a transistor comprising a semiconductor layer and a gate electrode stacked sequentially on the second region and disposed at the same vertical level as that of the modulator and configured to provide a drive signal as the electric signal to the modulator, wherein a height of the modulator in a vertical direction is equal to a height of the transistor in the vertical direction.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

A semiconductor device according to some exemplary embodiments may include a photonics device and a transistor. The semiconductor device according to some exemplary embodiments is related to an optical waveguide modulator and a transistor included in the photonics device. Hereinbelow, the description will be made with the main focus on the optical waveguide modulator and the transistor.

Figure 1:
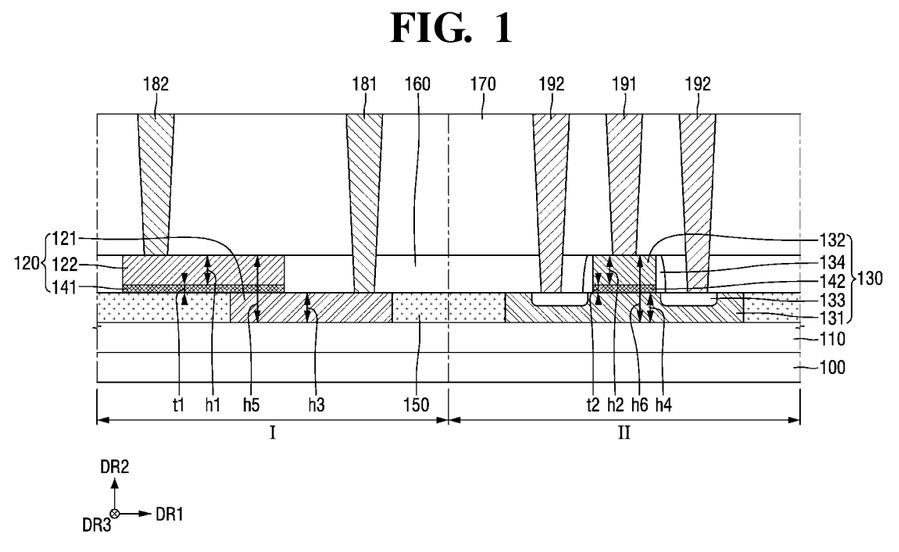
FIG. 1 is a view provided to explain a semiconductor device according to some exemplary embodiments.

The following will describe a semiconductor device according to some exemplary embodiments with reference to FIG. 1.

FIG. 1 is a view provided to explain a semiconductor device according to some exemplary embodiments.

Referring to FIG. 1, the semiconductor device may include a photonics device disposed in a first region I and a transistor disposed in a second region II. The first region I and the second region II may be spaced apart from each other in a first direction DR1 (a horizontal direction). For example, the first region I and the second region II may be horizontally aligned, or may be horizontally separated from each other by other regions. As used herein, a semiconductor device may refer, for example, to a device such as a semiconductor chip formed and cut from a wafer. In some examples, the photonics device may be a photonics circuit, an optical circuit, or an optical device.

The semiconductor device includes a base substrate 100, a first insulating layer 110, a photonics device (e.g., a modulator, an electro optic modulator, or an optical waveguide modulator) 120, a transistor 130, a first portion 141 of a second insulating layer, a second portion 142 of the second insulating layer, a device isolating region 150, a third insulating layer 160, a fourth insulating layer 170, a first doped layer contact 181, a second doped layer contact 182, a gate electrode contact 191 and a source/drain contact 192.

In some examples, an inverter (not shown) may include the transistor 130 and the inverter outputs a drive signal including one or more electrical signals (e.g., variable voltages) to the modulator 120. The modulator 120 may generate optical signals based on the electrical signals and output the optical signals to a photo-detect device (not shown) which detects the optical signals. The detected optical signals may be transmitted through an optical fiber cable.

The base substrate 100 may be a structure in which an epi-layer is stacked on the substrate, although the present disclosure is not limited thereto. The base substrate 100 may be, for example, a silicon substrate, a gallium arsenide substrate, a silicon germanium substrate, a ceramic substrate, a quartz substrate, or a glass substrate for display, or a semiconductor on insulator (SOI) substrate. Hereinbelow, a silicon substrate will be exemplified as the base substrate 100.

The base substrate 100 may include a first region I where the modulator 120 is disposed therein and a second region II where the transistor 130 is disposed therein. The first region I and the second region II are defined for convenience of explanation, and are not intended to necessarily indicate that the first region I and the second region II are divided.

The first insulating layer 110 may be disposed on the base substrate 100. The first insulating layer 110 and the base substrate 100 may form semiconductor on insulator (SOI). For example, the first insulating layer 110 may be disposed between the base substrate 100 and a first doped layer 121 and between the base substrate 100 and a semiconductor layer 131.

The first insulating layer 110 may include silicon oxide (SiO2), for example. However, the present disclosure is not limited thereto.

The modulator 120 may be disposed on the base substrate 100. Specifically, the modulator 120 may be disposed on the first insulating layer 110 in the first region I of the base substrate 100. The modulator 120 may be used as an optical waveguide modulator for the photonics device.

The modulator 120 may include the first doped layer 121, the first portion 141 of the second insulating layer and a second doped layer 122.

The first doped layer 121 may be disposed on the first insulating layer 110 in the first region I of the base substrate 100.

For example, the first doped layer 121 may include, for example, silicon (Si). The first doped layer 121 may be doped with an n-type impurity. However, the present disclosure is not limited thereto.

The first doped layer 121 may extend in a first direction DR1 and in a third direction DR3. The third direction DR3 indicates a direction orthogonal to the first direction DR1. In some examples, the first doped layer 121 may extend several μm in the first direction DR1 and extend several hundred μm in the third direction DR3.

The device isolating region 150 may be disposed on both sides of the first doped layer 121. For example, the device isolating region 150 may include at least one of silicon oxide (SiO2), silicon nitride (SiN), silicon carbide (SiC), silicon oxycarbide (SiOC), silicon oxynitride (SiON), and silicon oxycarbonitride (SiOCN).

The first portion 141 of the second insulating layer may be an intra-doped-layer oxide layer disposed between the first doped layer 121 and the second doped layer 122. The first portion 141 of the second insulating layer may be disposed on the first doped layer 121 so that at least a portion of the first portion 141 overlaps the first doped layer 121 and another portion of the first portion 141 overlaps the device isolating region 150. However, the present disclosure is not limited thereto.

The first portion 141 of the second insulating layer may include, for example, a high-k dielectric material. For example, the high-k dielectric material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but the present disclosure is not limited thereto.

The second doped layer 122 may be disposed on the first doped layer 121 so that at least a first portion of the second doped layer 122 overlap the first doped layer 121 and a second portion of the second doped layer 122 overlap the device isolating region 150. The second doped layer 122 may be disposed on the first portion 141 of the second insulating layer so as to completely overlap the first portion 141 of the second insulating layer.

The second doped layer 122 may include poly silicon (poly-Si), for example. The second doped layer 122 may be doped with a p-type impurity. However, the present disclosure is not limited thereto. According to some other exemplary embodiments, the first doped layer 121 may be doped with an n-type impurity and the second doped layer 122 may be doped with a p-type impurity.

The transistor 130 may be disposed on the base substrate 100. Specifically, the transistor 130 may be disposed on the first insulating layer 110 in the second region II of the base substrate 100. The transistor 130 may be disposed to be spaced apart from the modulator 120 in the first direction DR1. The transistor 130 may be disposed at the same vertical level as that of the modulator 120. However, the present disclosure is not limited thereto. The transistor 130 may be used as an integration circuit driving the photonics device.

The transistor 130 may include a semiconductor layer 131, a gate electrode 132, a source/drain region 133, a gate spacer 134, and the second portion 142 of the second insulating layer.

The semiconductor layer 131 may be disposed on the first insulating layer 110 in the second region II of the base substrate 100. The semiconductor layer 131 may be disposed at the same vertical level as that of the first doped layer 121. However, the is not limited thereto.

The semiconductor layer 131 may include, for example, silicon (Si). A p-type impurity may be doped within the semiconductor layer 131. However, the present disclosure is not limited thereto.

The device isolating region 150 may be disposed on both sides of the semiconductor layer 131. For example, the first doped layer 121 and the semiconductor layer 131 may be spaced apart from each other and disposed in the first direction DR1, and the device isolating region 150 may be disposed between the first doped layer 121 and the semiconductor layer 131.

A fourth height h4 of the semiconductor layer 131 in a second direction DR2 (i.e., a vertical direction) may be equal to a third height h3 of the first doped layer 121 in the second direction DR2. Hereinafter, "a height" may be referred to "a thickness" in a vertical direction. The second direction DR2 indicates a direction orthogonal to the first direction DR1 and third direction DR3.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The second portion 142 of the second insulating layer may be disposed on the semiconductor layer 131. The second portion 142 of the second insulating layer may be disposed at the same vertical level as that of the first portion 141 of the second insulating layer. However, the present disclosure is not limited thereto.

The second portion 142 of the second insulating layer may include the same material as that of the first portion 141 of the second insulating layer. For example, the second portion 142 of the second insulating layer may include a high-k dielectric material. However, the present disclosure is not limited thereto. The second portion 142 of the second insulating layer may perform a function of a gate insulating layer (i.e., a gate oxide layer) of the transistor 130.

A second thickness t2 of the second portion 142 of the second insulating layer in the second direction DR2 may be equal to a first thickness t1 of the first portion 141 of the second insulating layer in the second direction DR2.

The gate electrode 132 may be disposed on the second portion 142 of the second insulating layer so as to overlap the second portion 142 of the second insulating layer. The gate electrode 132 may be disposed at the same vertical level as that of the second doped layer 122. However, the present disclosure is not limited thereto.

The gate electrode 132 may include, for example, poly silicon (poly-Si), although the present disclosure is not limited thereto.

A second height h2 of the gate electrode 132 in the second direction DR2 may be equal to a first height h1 of the second doped layer 122 in the second direction DR2.

The gate spacer 134 may be disposed along both sidewalls of the gate electrode 132. The gate spacer 134 may include, for example, at least one of silicon nitride (SiN), silicon oxynitride (SiON), silicon oxide (SiO2), silicon oxycarbonitride (SiOCN), and a combination thereof, and multi layers may be stacked and formed instead of a single layer, differently from the drawings.

The source/drain region 133 may be formed within the semiconductor layer 131 disposed on both sides of the gate electrode 132.

Although it is illustrated in FIG. 1 that an upper surface of the source/drain region 133 is formed at the same plane as the upper surface of the semiconductor layer 131, the present disclosure is not limited thereto. For example, the source/drain region 133 may be an elevated source/drain region according to some other exemplary embodiments. In this case, an upper surface of the source/drain region 133 may be formed to be higher than an upper surface of the semiconductor layer 131.

A fifth height h5 of the modulator 120 in the second direction DR2 may be equal to a sixth height h6 of the transistor 130 in the second direction DR2. The above may be understood because heights in the second direction DR2 of respective elements included in the modulator 120 are equal to corresponding heights in the second direction DR2 of respective elements included in the transistor 130. However, the present disclosure is not limited thereto. For example, according to some other exemplary embodiments, a fifth height h5 of the modulator 120 in the second direction DR2 may be different from a sixth height h6 of the transistor 130 in the second direction DR2.

A third insulating layer 160 may be disposed so as to cover an exposed upper surface of the first doped layer 121, an exposed upper surface of the semiconductor layer 131, and an exposed upper surface of the device isolating region 150. The third insulating layer 160 may be disposed so as to cover a side surface of the second doped layer 122, a side surface of the first portion 141 of the second insulating layer, and a side surface of the gate spacer 134.

The third insulating layer 160 may include a low-k dielectric material. The third insulating layer 160 may include at least one of oxide film, nitride film and oxynitride film, for example.

The fourth insulating layer 170 may be disposed so as to cover an exposed upper surface of the second doped layer 122, an exposed upper surface of the gate electrode 132, and an upper surface of the third insulating layer 160.

The fourth insulating layer 170 may include a low-k dielectric material. The fourth insulating layer 170 may include, for example, at least one of oxide film, nitride film and oxynitride film.

The first doped layer contact 181 may be in contact with the first doped layer 121 by penetrating through the fourth insulating layer 170 and the third insulating layer 160 in the second direction DR2. The second doped layer contact 182 may be in contact with the second doped layer 122 by penetrating through the fourth insulating layer 170 in the second direction DR2. The gate electrode contact 191 may be in contact with the gate electrode 132 by penetrating through the fourth insulating layer 170 in the second direction DR2. The source/drain contact 192 may be in contact with the source/drain region 133 by penetrating through the fourth insulating layer 170 and the third insulating layer 160 in the second direction DR2. The term "contact," or "in contact with" as used herein refers to a direct connection (i.e., touching) unless the context indicates otherwise.

The first doped layer contact 181, the second doped layer contact 182, the gate electrode contact 191 and the source/drain contact 192 may respectively include, for example, at least one of aluminum (Al), tungsten (W), copper (Cu), cobalt (Co), or doped poly silicon (poly-Si).

The semiconductor device according to some exemplary embodiments may miniaturize the semiconductor device by integrating the photonics device and the transistor within the same semiconductor chip. Herein, the semiconductor chip may be cut from a wafer.

Further, the semiconductor device according to some exemplary embodiments may simplify manufacturing fabrication of the semiconductor device by disposing the modulator 120 and the transistor 130 included in the photonics device at the same vertical level through the same manufacturing fabrication, and accordingly, manufacturing cost of the semiconductor device may be reduced.

In some examples, a voltage from the transistor 130 is applied to one of the first and second doped layers 121 and 122 so as to accumulate carriers (e.g., electrons or holes) near a first contact portion where the first doped layer 121 contacts one side of the first portion 141 of the second insulating layer and near a second contact portion where the second doped layer 122 contacts the other side of the first portion 141 of the second insulating layer.

In some examples, the modulator 120 may generate one or more optical signals based on an amount of the carriers accumulated by the applied voltage from the transistor 130.

Hereinbelow, a method for fabricating the semiconductor device according to some exemplary embodiments will be described with reference to FIG. 1 to FIG. 8.

FIG. 2 to FIG. 8 are views illustrating intermediate stages of fabrication, provided to explain a method for fabricating the semiconductor device according to some exemplary embodiments.

Figure 2:
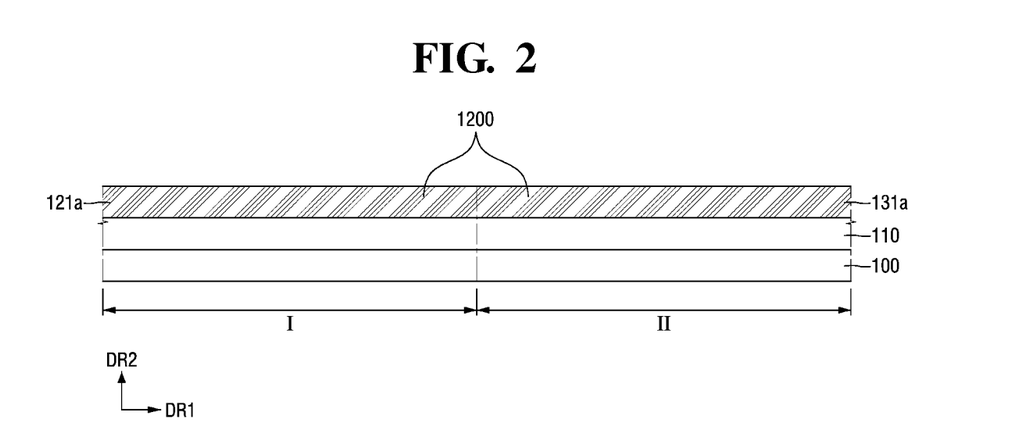
FIG. 2 to FIG. 8 are views illustrating intermediate stages of fabrication, provided to explain a method for fabricating a semiconductor device according to some exemplary embodiments.

Referring to FIG. 2, the first insulating layer 110 and a first semiconductor material layer 1200 may be sequentially stacked on the base substrate 100.

The first semiconductor material layer 1200 may include the first portion 121a formed in the first region I of the base substrate 100 and the second portion 131a formed in the second region II of the base substrate 100. The first semiconductor material layer 1200 may include silicon (Si), for example.

By using a mask pattern, the first portion 121a of the first semiconductor material layer 1200 may be doped with an n-type impurity and the second portion 131a of the first semiconductor material layer 1200 may be doped with a p-type impurity. In some examples, by using a mask pattern, the first portion 121a of the first semiconductor material layer 1200 may be doped with a p-type impurity and the second portion 131a of the first semiconductor material layer 1200 may be doped with an n-type impurity.

Figure 3:
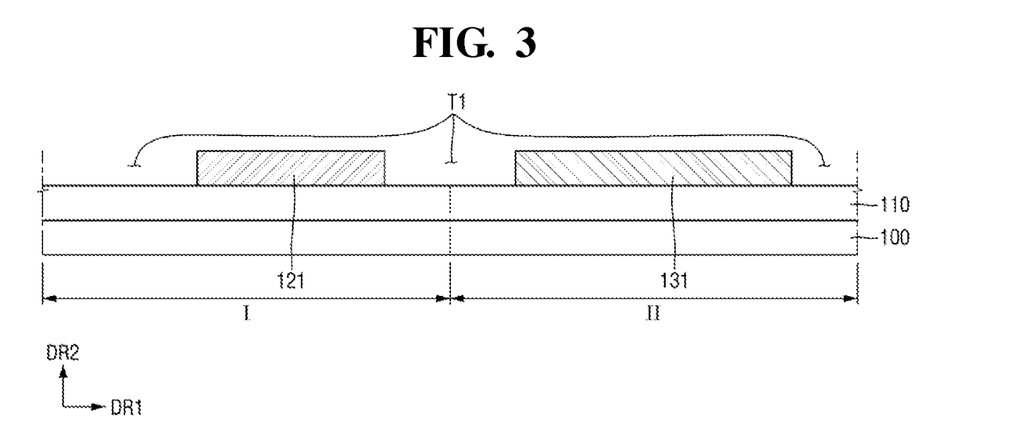

Referring to FIG. 3, a first trench T1 may be formed on the first insulating layer 110 by etching the first and second portions 121a and 131a in utilization of mask pattern.

Through the etch fabrication, the first doped layer 121 may be formed on the first insulating layer 110 in the first region I of the base substrate 100, and the semiconductor layer 131 may be formed on the first insulating layer 110 in the second region II of the base substrate 100. The first doped layer 121 and the semiconductor layer 131 may be spaced apart from each other by the first trench T1 in the first direction DR1.

The first doped layer 121 and the semiconductor layer 131 may be formed through one fabrication of etching the first and second portions 121a and 131a. Accordingly, the first doped layer 121 and the semiconductor layer 131 may be formed at the same vertical level. Further, a third height h3 of FIG. 1 of the first doped layer 121 in the second direction DR2 may be formed equally to a fourth height h4 of FIG. 1 of the semiconductor layer 131 in the second direction DR2.

Figure 4:
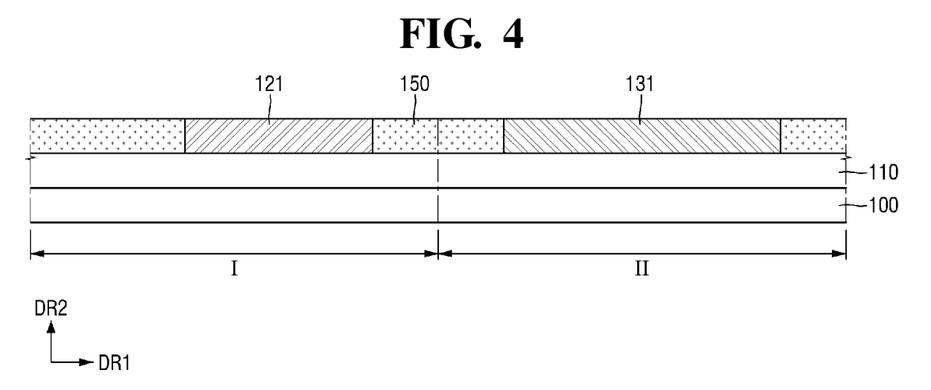

Referring to FIG. 4, the device isolating region 150 may be formed within the first trench T1 of FIG. 3.

Figure 5:
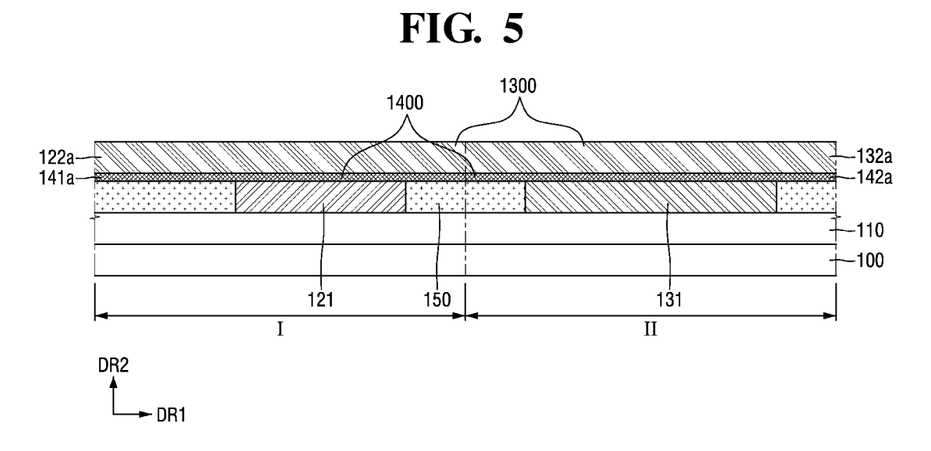

Referring to FIG. 5, a first part 141a of a second insulating layer 1400, a second part 142a of the second insulating layer 1400, a first portion 122a of a second semiconductor material layer 1300, and a second portion 132a of the second semiconductor material layer 1300 may be sequentially stacked on the first doped layer 121, the semiconductor layer 131 and the device isolating region 150.

The second insulating layer 1400 may include the first part 141a of the second insulating layer 1400 formed in the first region I of the base substrate 100 and the second part 142a of the second insulating layer 1400 formed in the second region II of the base substrate 100. Each of the first and second parts 141a and 142a of the second insulating layer 1400 may include a high-k dielectric material.

The second semiconductor material layer 1300 may include the first portion 122a formed on the first region I of the base substrate 100 and the second portion 132a formed on the second region II of the base substrate 100. The second semiconductor material layer 1300 may include, for example, poly silicon (poly-Si). The first portion 122a of the second semiconductor material layer 1300 may be doped with a p-type impurity. In some examples, the first portion 122a of the second semiconductor material layer 1300 may be doped with an n-type impurity.

Figure 6:
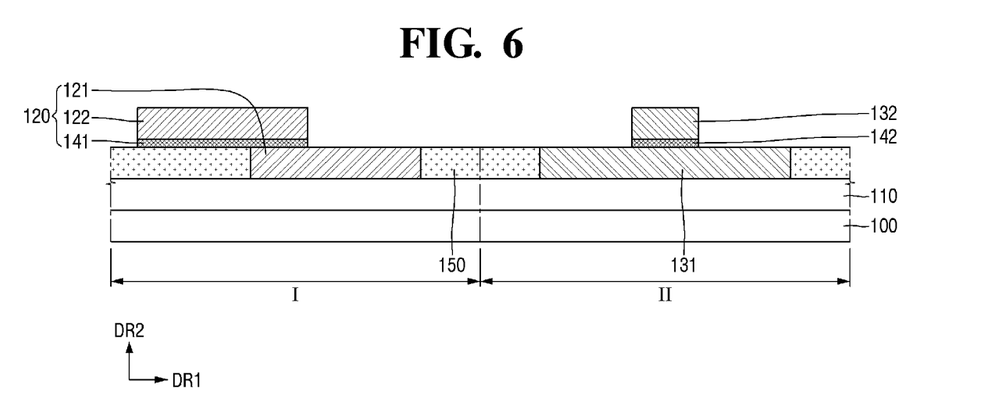

Referring to FIG. 6, a portion of each of the first and second portions 122a and 132a and a portion of each of the first and second parts 141a and 142a may be etched by using a mask pattern.

Through the etching fabrication, there may be formed the first portion 141 of the second insulating layer and the second doped layer 122 sequentially stacked on the first doped layer 121 and the device isolating region 150 in the first region I of the base substrate 100. Further, through the etching fabrication, there may be formed the second portion 142 of the second insulating layer and the gate electrode 132 sequentially stacked on the semiconductor layer 131 in the second region II of the base substrate 100.

The first portion 141 of the second insulating layer and the second portion 142 of the second insulating layer may be formed through one fabrication of etching the first and second parts 141a and 142a. Accordingly, the first portion 141 of the second insulating layer and the second portion 142 of the second insulating layer may be formed at the same vertical level. Further, a first thickness t1 of FIG. 1 of the first portion 141 of the second insulating layer in the second direction DR2 may be formed equally to a second thickness t2 of FIG. 1 of the second portion 142 of the second insulating layer in the second direction DR2.

Further, the second doped layer 122 and the gate electrode 132 may be formed through one fabrication of etching the first and second portions 122a and 132a. Accordingly, the second doped layer 122 and the gate electrode 132 may be formed at the same vertical level. Further, a first height h1 of FIG. 1 of the second doped layer 122 in the second direction DR2 may be formed equally to a second height h2 of FIG. 1 of the gate electrode 132 in the second direction DR2.

The first portion 141 of the second insulating layer may be formed so as to completely overlap the second doped layer 122, and the second portion 142 of the second insulating layer may be formed so as to completely overlap the gate electrode 132.

The second doped layer 122 may be formed so that at least a portion of the second doped layer 122 overlaps the first doped layer 121 and another portion of the second doped layer 122 overlaps the device isolating region 150.

Through the above fabrication, the modulator 120 including the first doped layer 121, the second doped layer 122 and the first portion 141 of the second insulating layer may be formed in the first region I of the base substrate 100.

Figure 7:
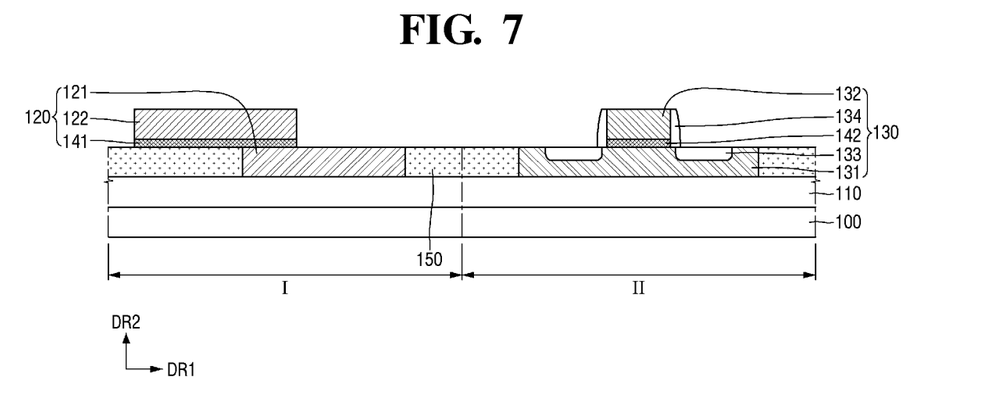

Referring to FIG. 7, the gate spacer 134 may be formed along both sidewalls of the gate electrode 132 and the second portion 142 of the second insulating layer.

Next, the source/drain region 133 may be formed on both sides of the gate electrode 132 by doping impurity within the semiconductor layer 131.

Through the above fabrication, the transistor 130 including the semiconductor layer 131, the gate electrode 132, the source/drain region 133, the gate spacer 134, and the second portion 142 of the second insulating layer may be formed in the second region II of the base substrate 100.

Figure 8:
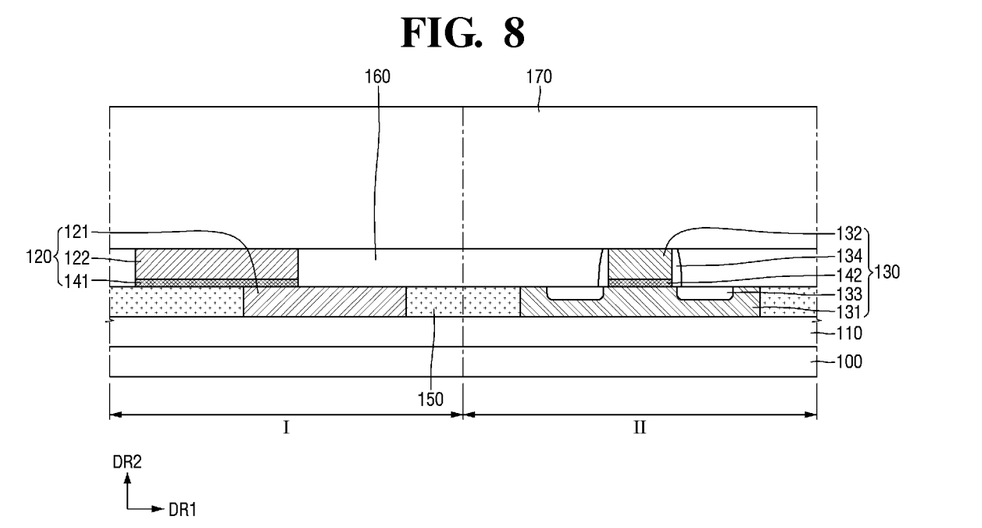

Referring to FIG. 8, there may be formed the third insulating layer 160 so as to cover an upper surface of the first doped layer 121, an upper surface of the semiconductor layer 131, an upper surface of the device isolating region 150, a side surface of the modulator 120, and a side surface of the gate spacer 134.

Next, the fourth insulating layer 170 may be formed so as to cover an upper surface of the second doped layer 122, an upper surface of the gate electrode 132, and an upper surface of the third insulating layer 160.

Referring to FIG. 1, a plurality of trenches may be formed by etching the fourth insulating layer 170 and the third insulating layer 160. The first doped layer contact 181, the second doped layer contact 182, the gate electrode contact 191 and the source/drain contact 192 may be formed within each of the trenches.

Specifically, the first doped layer contact 181 may be formed within the trench in which an upper surface of the first doped layer 121 is exposed by etching the fourth insulating layer 170 and the third insulating layer 160. The second doped layer contact 182 may be formed within the trench in which an upper surface of the second doped layer 122 is exposed by etching the fourth insulating layer 170. The gate electrode contact 191 may be formed within the trench in which an upper surface of the gate electrode 132 is exposed by etching the fourth insulating layer 170. The source/drain contact 192 may be formed within the trench in which an upper surface of the source/drain region 133 is exposed by etching the fourth insulating layer 170 and the third insulating layer 160.

The semiconductor device according to some exemplary embodiments may be manufactured through the above-described fabrication.

Hereinbelow, a semiconductor device according to some other exemplary embodiments will be described with reference to FIG. 9. The description will be made with the main focus on the differences from the semiconductor device illustrated in FIG. 1.

Figure 9:
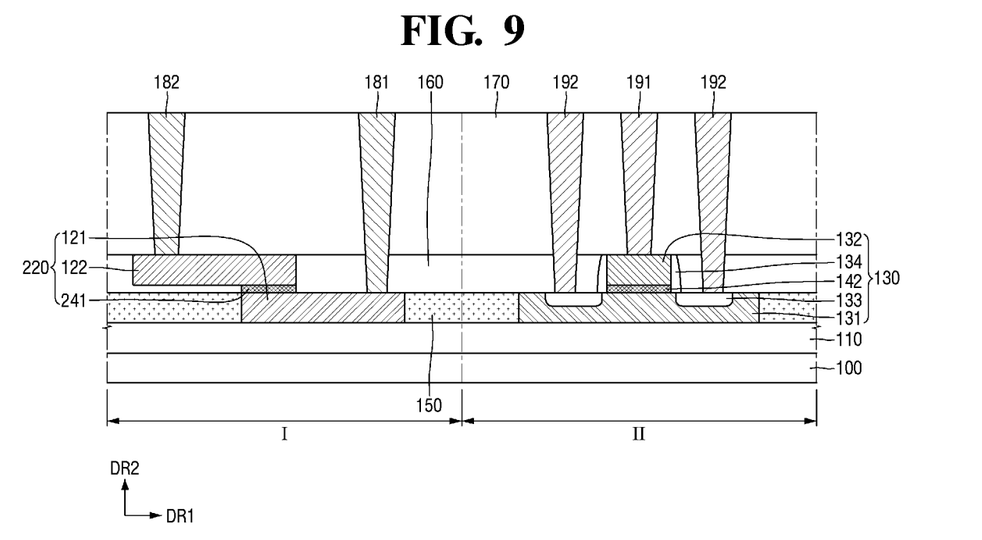
FIG. 9 is a view provided to explain a semiconductor device according to some other exemplary embodiments.

FIG. 9 is a view provided to explain a semiconductor device according to some other exemplary embodiments.

Referring to FIG. 9, in the semiconductor device according to some other exemplary embodiments, a modulator 220 may include the first doped layer 121, a first portion 241 of the second insulating layer and the second doped layer 122.

The first portion 241 of the second insulating layer may be disposed only between the first doped layer 121 and the second doped layer 122. For example, the first portion 241 of the second insulating layer is not disposed between the second doped layer 122 and the device isolating region 150.

Although it is illustrated in FIG. 9 that the third insulating layer 160 is disposed between the second doped layer 122 and the device isolating region 150, the present disclosure is not limited thereto. For example, according to some other exemplary embodiments, additional insulating layer may be disposed between the second doped layer 122 and the device isolating region 150.

Hereinbelow, a semiconductor device according to some other exemplary embodiments will be described with reference to FIG. 10. The description will be made with the main focus on the differences from the semiconductor device illustrated in FIG. 1.

Figure 10:
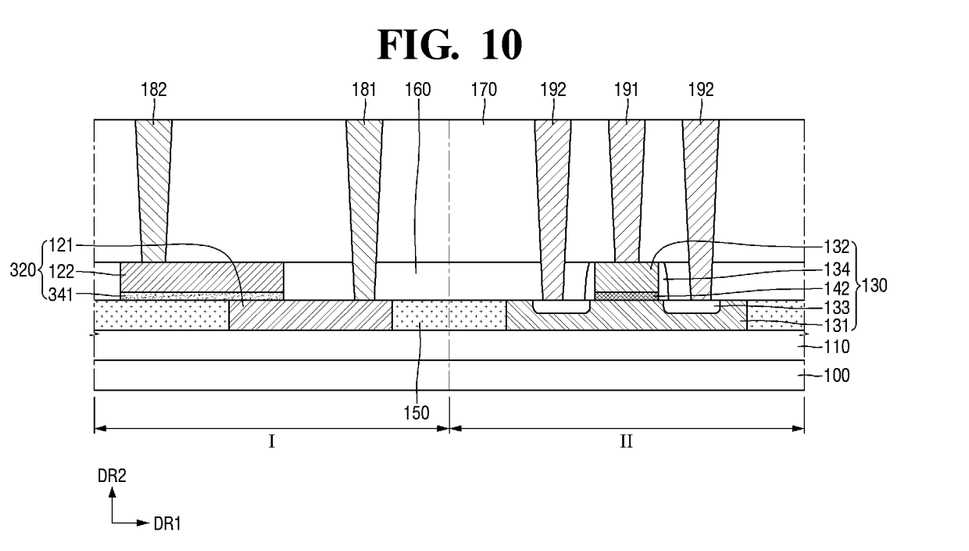
FIG. 10 is a view provided to explain a semiconductor device according to some other exemplary embodiments.

FIG. 10 is a view provided to explain a semiconductor device according to some other exemplary embodiments.

Referring to FIG. 10, in the semiconductor device according to some other exemplary embodiments, a modulator 320 may include the first doped layer 121, a first portion 341 of the second insulating layer, and the second doped layer 122.

The first portion 341 of the second insulating layer may include at least one of silicon oxide, silicon nitride, silicon oxynitride, and a low-k dielectric material. For example, the first portion 341 of the second insulating layer disposed between the first doped layer 121 and the second doped layer 122 may include a low-k dielectric material, and the second portion 142 of the second insulating layer disposed between the semiconductor layer 131 and the gate electrode 132 may include a high-k dielectric material.

For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Hereinbelow, a semiconductor device according to some other exemplary embodiments will be described with reference to FIG. 11. The description will be made with the main focus on the differences from the semiconductor device illustrated in FIG. 1.

Figure 11:
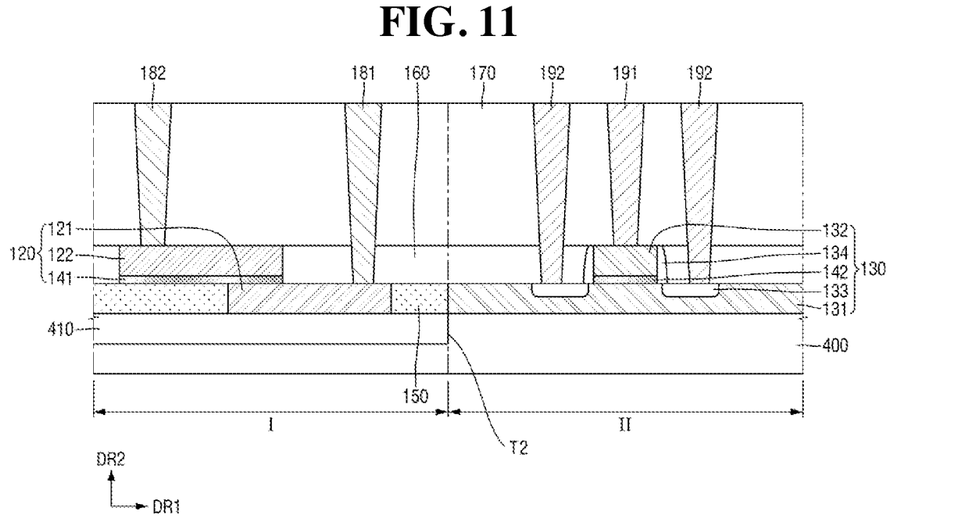
FIG. 11 is a view provided to explain a semiconductor device according to some other exemplary embodiments.

FIG. 11 is a view provided to explain a semiconductor device according to some other exemplary embodiments.

Referring to FIG. 11, in the semiconductor device according to some other exemplary embodiments, a second trench T2 may be formed in the first region I of a base substrate 400. A first insulating layer 410 may be disposed within the second trench T2.

The semiconductor layer 131 may be disposed so as to be in direct contact with the base substrate 400 in the second region II of the base substrate 400. For example, the first insulating layer 410 may not be disposed between the semiconductor layer 131 and the base substrate 400.

Hereinbelow, a semiconductor device according to some other exemplary embodiments will be described with reference to FIG. 12. The description will be made with the main focus on the differences from the semiconductor device illustrated in FIG. 1.

Figure 12:
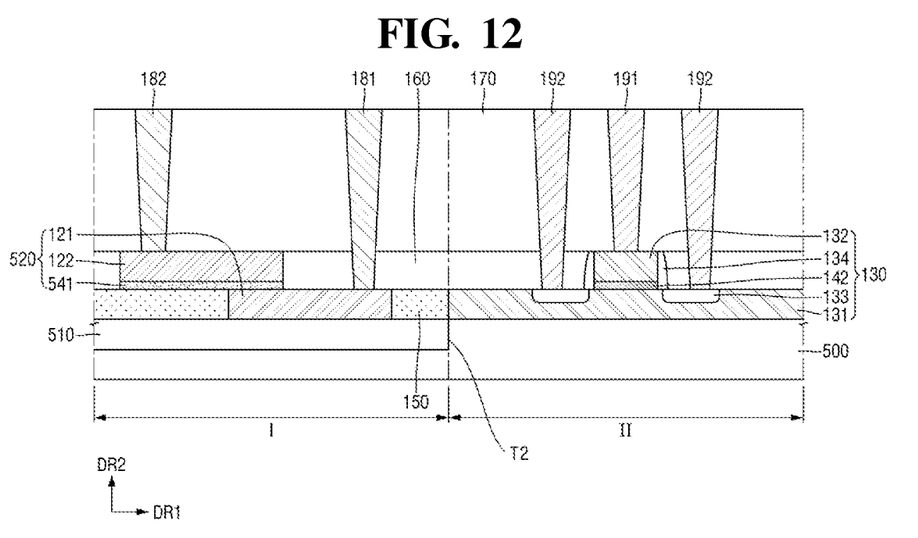
FIG. 12 is a view provided to explain a semiconductor device according to some other exemplary embodiments.

FIG. 12 is a view provided to explain a semiconductor device according to some other exemplary embodiments.

Referring to FIG. 12, in the semiconductor device according to some other exemplary embodiments, the second trench T2 may be formed in the first region I of a base substrate 500. A first insulating layer 510 may be disposed within the second trench T2.

The semiconductor layer 131 may be disposed so as to be in direct contact with the base substrate 500 in the second region II of the base substrate 500. For example, the first insulating layer 510 may not be disposed between the semiconductor layer 131 and the base substrate 500.

A modulator 520 may include the first doped layer 121, a first portion 541 of the second insulating layer, and the second doped layer 122.

The first portion 541 of the second insulating layer may include at least one of silicon oxide, silicon nitride, silicon oxynitride, and a low-k dielectric material. For example, the first portion 541 of the second insulating layer disposed between the first doped layer 121 and the second doped layer 122 may include a low-k dielectric material, and the second portion 142 of the second insulating layer disposed between the semiconductor layer 131 and the gate electrode 132 may include a high-k dielectric material.

Exemplary embodiments according to the present disclosure were explained hereinabove with reference to the drawings attached, but it should be understood that the present disclosure is not limited to the aforementioned exemplary embodiments, but may be fabricated in various different forms, and may be implemented by a person skilled in the art in other specific forms without altering the technical concept or essential characteristics of the present disclosure. Accordingly, all such various different forms are intended to be included within the scope of the present disclosure as defined in the claims.

What is claimed is:

1. A semiconductor device, comprising:
   a base substrate comprising a first region and a second region spaced apart from each other in a first direction;
   a photonics device disposed in the first region and configured to generate an optical signal based on an electrical signal, the photonics device comprising:
   a first doped layer disposed on the base substrate; and
   a second doped layer disposed on the first doped layer so that at least a portion of the second doped layer overlaps the first doped layer in a second direction orthogonal to the first direction, the second doped layer having a first thickness in the second direction; and
   a transistor disposed in the second region and configured to provide a drive signal as the electrical signal to the photonics device, the transistor comprising:
   a semiconductor layer disposed on the base substrate and spaced apart from the first doped layer in the first direction; and
   a gate electrode spaced apart from the second doped layer in the first direction and disposed on the semiconductor layer, disposed at the same vertical level in the second direction as that of the second doped layer, and having a second thickness in the second direction equal to the first thickness of the second doped layer.

2. The semiconductor device of claim 1, further comprising a first insulating layer disposed between the base substrate and the first doped layer and between the base substrate and the semiconductor layer.

3. The semiconductor device of claim 2, further comprising a second insulating layer comprising a first portion disposed between the first doped layer and the second doped layer and a second portion disposed between the semiconductor layer and the gate electrode,
wherein the first portion of the second insulating layer and the second portion of the second insulating layer are disposed at the same vertical level in the second direction.

4. The semiconductor device of claim 3, wherein the second insulating layer comprises a high-k dielectric material.

5. The semiconductor device of claim 3, wherein a first thickness of the first portion of the second insulating layer in the second direction is equal to a second thickness of the second portion of the second insulating layer in the second direction.

6. The semiconductor device of claim 3, wherein the first portion of the second insulating layer and the second portion of the second insulating layer are disposed at the same vertical level in the second direction.

7. The semiconductor device of claim 3, wherein the first portion of the second insulating layer completely overlaps the second doped layer.

8. The semiconductor device of claim 3, wherein the first portion of the second insulating layer is disposed only between the first doped layer and the second doped layer.

9. The semiconductor device of claim 3, wherein the first portion of the second insulating layer comprises a low-k dielectric material, and the second portion of the second insulating layer comprises a high-k dielectric material.

10. The semiconductor device of claim 1, further comprising a first insulating layer disposed between the base substrate and the first doped layer,
wherein the base substrate is in contact with the semiconductor layer.

11. A semiconductor device, comprising:
    a base substrate comprising a first region and a second region spaced apart from each other in a first direction;
    a first insulating layer disposed on the base substrate;
    a photonics circuit disposed in the first region and configured to transform an electric signal to an optical signal, the photonics circuit comprising:
    a first doped layer disposed on the first insulating layer in the first region;
    a first portion of a second insulating layer disposed on at least a portion of the first doped layer; and
    a second doped layer disposed on the first doped layer and having a first thickness in a second direction perpendicular to the first direction; and
    a transistor disposed in the second region and configured to provide a drive signal as the electric signal to the photonics circuit, the transistor comprising:
    a semiconductor layer disposed in the second region; and
    a gate electrode disposed on a second portion of the second insulating layer in the second region and having a second thickness in the second direction equal to the first thickness of the second doped layer.

12. The semiconductor device of claim 11, wherein the second doped layer and the gate electrode are disposed at the same vertical level in the second direction.

13. The semiconductor device of claim 11, wherein the first doped layer and the semiconductor layer are disposed at the same vertical level in the second direction.

14. The semiconductor device of claim 11, wherein a thickness of the first doped layer in the second direction is equal to a thickness of the semiconductor layer in the second direction.

15. The semiconductor device of claim 11, wherein the first portion of the second insulating layer and the second portion of the second insulating layer are disposed at the same vertical level in the second direction.

16. The semiconductor device of claim 15, wherein the first portion of the second insulating layer comprises a low-k dielectric material, and
   wherein the second portion of the second insulating layer comprises a high-k dielectric material.

17. A semiconductor device, comprising:
   a base substrate comprising a first region and a second region horizontally spaced apart from each other;
   a modulator comprising a first doped layer and a second doped layer stacked sequentially on the base substrate in the first region, and configured to generate an optical signal based on an electric signal; and
   a transistor comprising a semiconductor layer and a gate electrode stacked sequentially on the base substrate in the second region and disposed at the same vertical level as that of the modulator, and configured to provide a drive signal as the electric signal to the modulator,
   wherein a height of the modulator in a vertical direction is equal to a height of the transistor in the vertical direction.

18. The semiconductor device of claim 17, wherein a first vertical thickness of the second doped layer is equal to a second vertical thickness of the gate electrode.

19. The semiconductor device of claim 17, wherein the second doped layer and the gate electrode are disposed at the same vertical level.

20. The semiconductor device of claim 17, further comprising an insulating layer disposed between the first doped layer and the second doped layer and between the semiconductor layer and the gate electrode, and comprising a high-k dielectric material.

* * * * *